United States Patent [19]
Shibata

[11] Patent Number: 6,034,437
[45] Date of Patent: Mar. 7, 2000

[54] SEMICONDUCTOR DEVICE HAVING A MATRIX OF BONDING PADS

[75] Inventor: Kazutaka Shibata, Kyoto, Japan

[73] Assignee: Rohm Co., Ltd., Kyoto, Japan

[21] Appl. No.: 09/092,601

[22] Filed: Jun. 5, 1998

[30] Foreign Application Priority Data

Jun. 6, 1997 [JP] Japan ..................... 9-149251

[51] Int. Cl.[7] .......... H01L 23/48; H01L 23/52; H01L 29/40
[52] U.S. Cl. ............................ 257/783; 257/782
[58] Field of Search ................. 257/758, 759, 257/760, 747, 698, 700, 701

[56] References Cited

U.S. PATENT DOCUMENTS

| | | |
|---|---|---|
| 5,352,926 | 10/1994 | Andrews . |
| 5,523,622 | 6/1996 | Harada et al. . |
| 5,703,405 | 12/1997 | Zeber . |
| 5,786,271 | 7/1998 | Ohida et al. . |
| 5,834,844 | 11/1998 | Akagawa et al. . |
| 5,844,304 | 12/1998 | Kata et al. . |
| 5,886,409 | 3/1999 | Ishino et al. . |
| 5,886,415 | 3/1999 | Akagawa . |

*Primary Examiner*—Sheila V. Clark
*Attorney, Agent, or Firm*—Merchant & Gould P.C.

[57] ABSTRACT

A semiconductor device includes a semiconductor chip and an intermediary buffer board attached to the chip. The chip includes a plurality of electrode pads on the semiconductor chip, an insulating member formed on the mounting surface of the semiconductor chip, a conductor pattern formed on the insulating member and electrically connected to the electrode pads, and a plurality of first terminals provided on the insulating member in electrical connection to the conductor pattern. The buffer board has a plurality of second terminals provided in corresponding relationship to the first terminals in electrical connection thereto.

9 Claims, 8 Drawing Sheets

F I G. 16
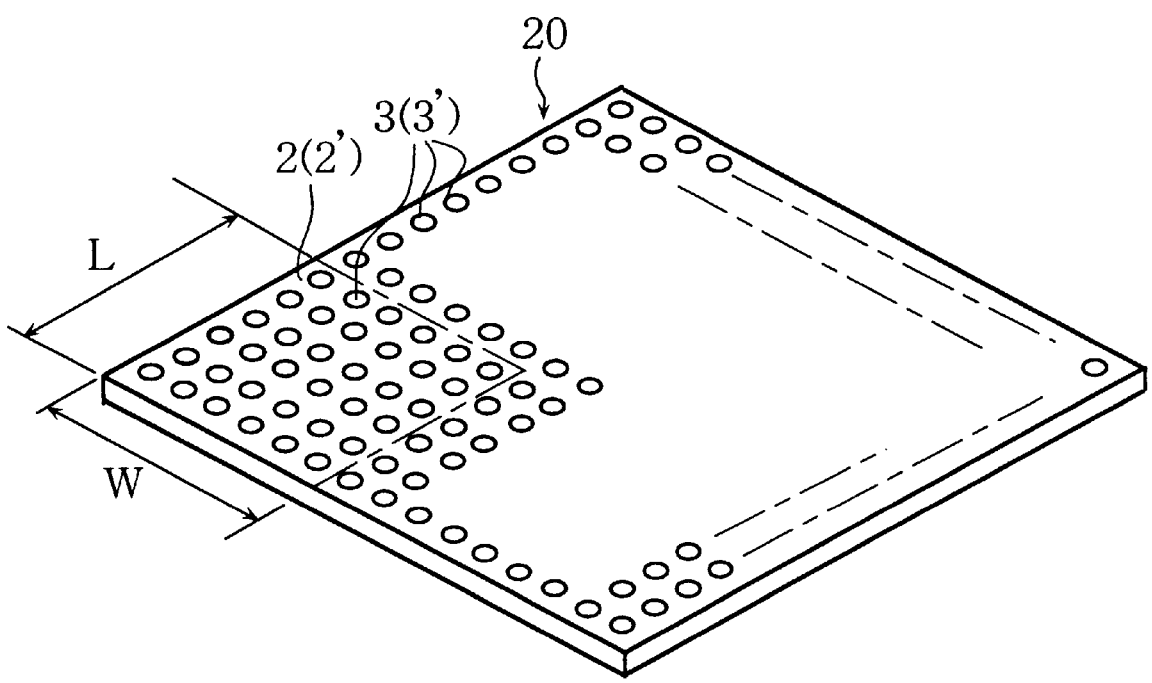

SEMICONDUCTOR DEVICE HAVING A MATRIX OF BONDING PADS

BACKGROUND OF THE INVENTION

1. Field of the Invention

The present invention relates to a semiconductor device of the type which has a plurality of terminals in a bonding area for electrical connection to a corresponding number of bonding pads on a printed circuit board.

2. Description of the Related Art

In general, a semiconductor device of the above described type includes a semiconductor chip such as an IC chip having a mounting surface provided with a plurality of electrode pads along the edges of the chip mounting surface, and an intermediary buffer board attached to the mounting surface of the chip. The buffer board has a matrix of terminals and a wiring pattern for electrically connecting the electrode pads of the chip to the respective terminals of the buffer board.

In use, the semiconductor device is mounted on a printed circuit board in a manner such that the matrix of terminals of the buffer board comes into contact with a corresponding matrix of bonding pads on the printed circuit board. Each of the terminals of the buffer board may be a solder bump which fuses under heating to a corresponding one of the bonding pads on the printed circuit board. The buffer board absorbs or allows for a linear expansion difference between the semiconductor chip and the printed circuit board when heated for soldering, so that the semiconductor chip is prevented from being damaged due to such an expansion difference.

In production, use is made of a master buffer board which is cut into a plurality of unit buffer boards for making a corresponding number of semiconductor devices. However, since the master buffer board needs to be provided with a specific wiring pattern for each of the unit buffer boards, the same master buffer board cannot be used for preparing a plurality of unit buffer boards suitable for different types of semiconductor chips. In other words, a different master buffer board must be used for each different type of semiconductor device, which results in a production cost increase.

SUMMARY OF THE INVENTION

It is therefore an object of the present invention to provide a semiconductor device which is capable of eliminating or reducing the above-described problems of the prior art.

According to a first aspect of the present invention, there is provided a semiconductor device comprising: a semiconductor chip having a mounting surface; a plurality of electrode pads formed on the mounting surface of the semiconductor chip; an insulating member formed on the mounting surface of the semiconductor chip; a conductor pattern formed on the insulating member and electrically connected to the electrode pads; and a plurality of terminals provided on the insulating member in electrical connection to the conductor pattern.

Typically, the electrode pads may be disposed in marginal portions of the mounting surface, whereas the terminals may be arranged in a bonding area surrounded by the marginal portions of the mounting surface.

According to a preferred embodiment of the present invention, the insulating member includes a first insulating layer formed on the mounting surface of the semiconductor chip and a second insulating layer formed on the first insulating surface. The first insulating layer has a plurality of first via-holes in corresponding relationship to the electrode pads, and the conductor pattern are formed on the first insulating layer in electrical connection to the electrode pads through the first via-holes. Further, the second insulating layer has plurality of second via-holes formed in the bonding area, and each of the second via-holes receives a respective one of the terminals in electrical conduction with the conductor pattern.

Preferably, the conductor pattern may comprise a plurality of via-portions each provided in a respective one of the first via-holes of the first insulating layer, a plurality of connecting pads formed on the first insulating layer in corresponding relationship to the terminals, and a plurality of wiring portions formed on the first insulating layer. In this case, each of the wiring portions connects a respective one of the via-portions to a respective one of the connecting pads.

Each of the terminals may preferably comprise a metal bump. Further, the terminals may be advantageously disposed in a matrix arrangement in the bonding area.

According to a second aspect of the present invention, there is provided a semiconductor device comprising: a semiconductor chip having a mounting surface; a plurality of electrode pads formed on the mounting surface of the semiconductor chip; an insulating member formed on the mounting surface of the semiconductor chip; a conductor pattern formed on the insulating member and electrically connected to the electrode pads; a plurality of first terminals provided on the insulating member in electrical connection to the conductor pattern; and an intermediary buffer board attached to the insulating member, the buffer board having a plurality of second terminals provided in corresponding relationship to the first terminals in electrical connection thereto.

Typically, the electrode pads may be disposed in marginal portions of the mounting surface, whereas the first terminals may be arranged in a bonding area surrounded by the marginal portions of the mounting surface.

In a preferred embodiment of the second aspect of the present invention, the insulating member includes a first insulating layer formed on the mounting surface of the semiconductor chip and a second insulating layer formed on the first insulating surface. The first insulating layer has a plurality of first via-holes in corresponding relationship to the electrode pads, and the conductor pattern are formed on the first insulating layer in electrical connection to the electrode pads through the first via-holes. Further, the second insulating layer having a plurality of second via-holes formed in the bonding area, each of the second via-holes receiving a respective one of the first terminals in electrical conduction with the conductor pattern.

Preferably, the conductor pattern may comprise a plurality of via-portions each provided in a respective one of the first via-holes of the first insulating layer, a plurality of connecting pads formed on the first insulating layer in corresponding relationship to the first terminals, and a plurality of wiring portions formed on the first insulating layer. In this case, each of the wiring portions connects a respective one of the via-portions to a respective one of the connecting pads.

Preferably, each of the first and second terminals may comprise a metal bump. Further, the first terminals may be advantageously disposed in a matrix arrangement in the bonding area. Similarly, the second terminals may be disposed in a matrix arrangement in the corresponding relationship to the first terminals.

The buffer board may preferably have a plurality of through-holes each receiving a respective one of the second terminals.

Other features and advantages of the present invention should become clear from the detailed description to be made hereinafter referring to the accompanied drawings.

BRIEF DESCRIPTION OF THE DRAWINGS

In the accompanying drawings:

FIG. 16 is a perspective view showing a master buffer board from which a plurality of unit buffer boards are obtained.

DETAILED DESCRIPTION OF THE PREFERRED EMBODIMENT

The preferred embodiment of the present invention will be specifically described below with reference to the accompanying drawings.

Figure 1:
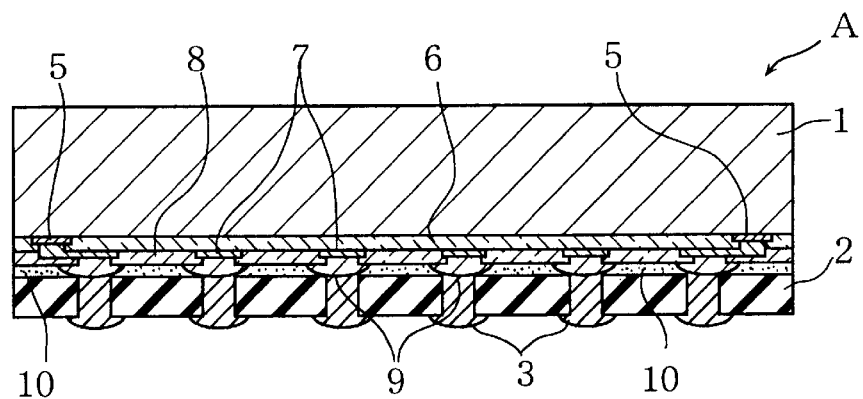
FIG. 1 is a view, in vertical section, showing a semiconductor device embodying the present invention.

Referring first to FIG. 1, a semiconductor device A according to the preferred embodiment of the present invention mainly includes a semiconductor chip 1 and an intermediary buffer board 2 attached to the bottom surface of the chip 1. The intermediary buffer board 2 has a matrix of terminals 3 for external connection, as more specifically described hereinafter. In the illustrated embodiment, each of the terminals is provided in the form of a metal bump.

Figure 2:
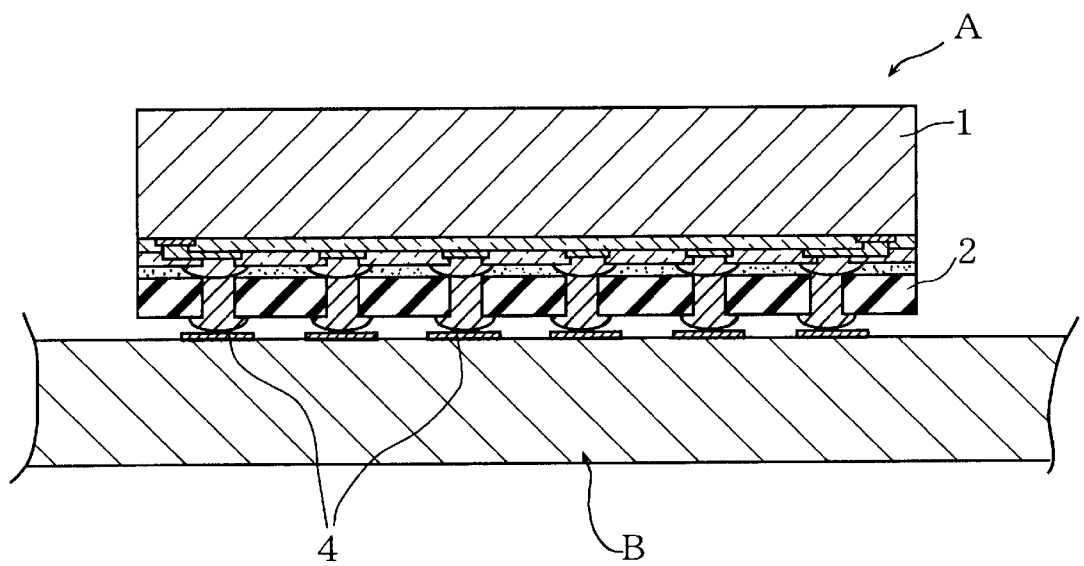
FIG. 2 is a view, in vertical section, showing the same semiconductor device as mounted on a printed circuit board.

As shown in FIG. 2, the semiconductor device A may be mounted on a printed circuit board B by reflow soldering for example. Alternatively, the semiconductor device A may be mounted on the printed circuit board B by interposing a layer of anisotropic conductive resin. The printed circuit board B has a matrix of bonding pads 4 in corresponding relationship to the matrix of terminals 3 of the semiconductor device A.

Next, the more specific structure of the semiconductor device A will be described by referring to the successive steps of production on the basis of FIGS. 3 through 14.

Figure 3:
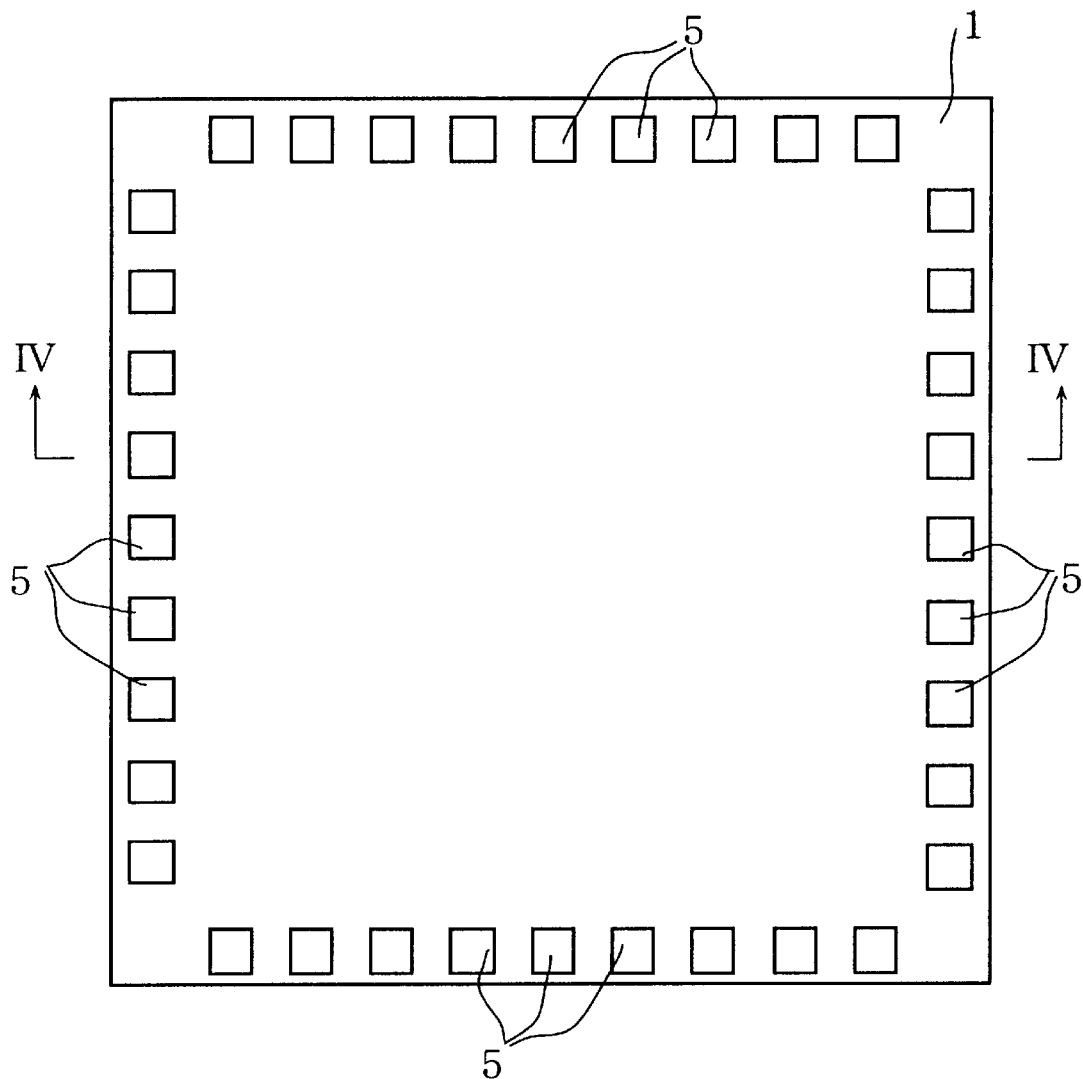
FIG. 3 is a bottom view showing a semiconductor chip for use in producing the same semiconductor device.
Figure 4:
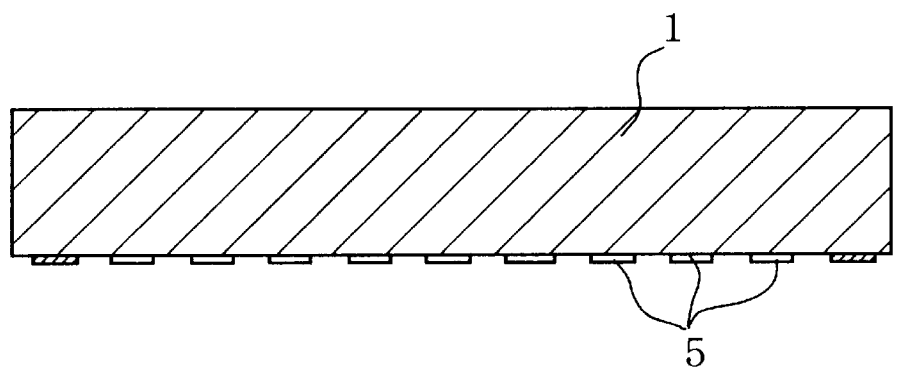
FIG. 4 is a sectional view taken on lines IV—IV in FIG. 3.

First, as shown in FIGS. 3 and 4, a semiconductor chip 1 is prepared which has a plurality of electrode pads 5 on the bottom surface of the chip. The semiconductor chip 1 may be a square IC chip incorporating various circuit elements built in a silicon wafer. The electrode pads are used for electrically connecting the various circuit elements of the IC chip 1 to an outside circuit. In the illustrated embodiment, the electrode pads 5 are arranged in four groups each extending along a side of the square IC chip 1. The electrode pads 5 in each group may be spaced from each other at a constant pitch.

Figure 5:
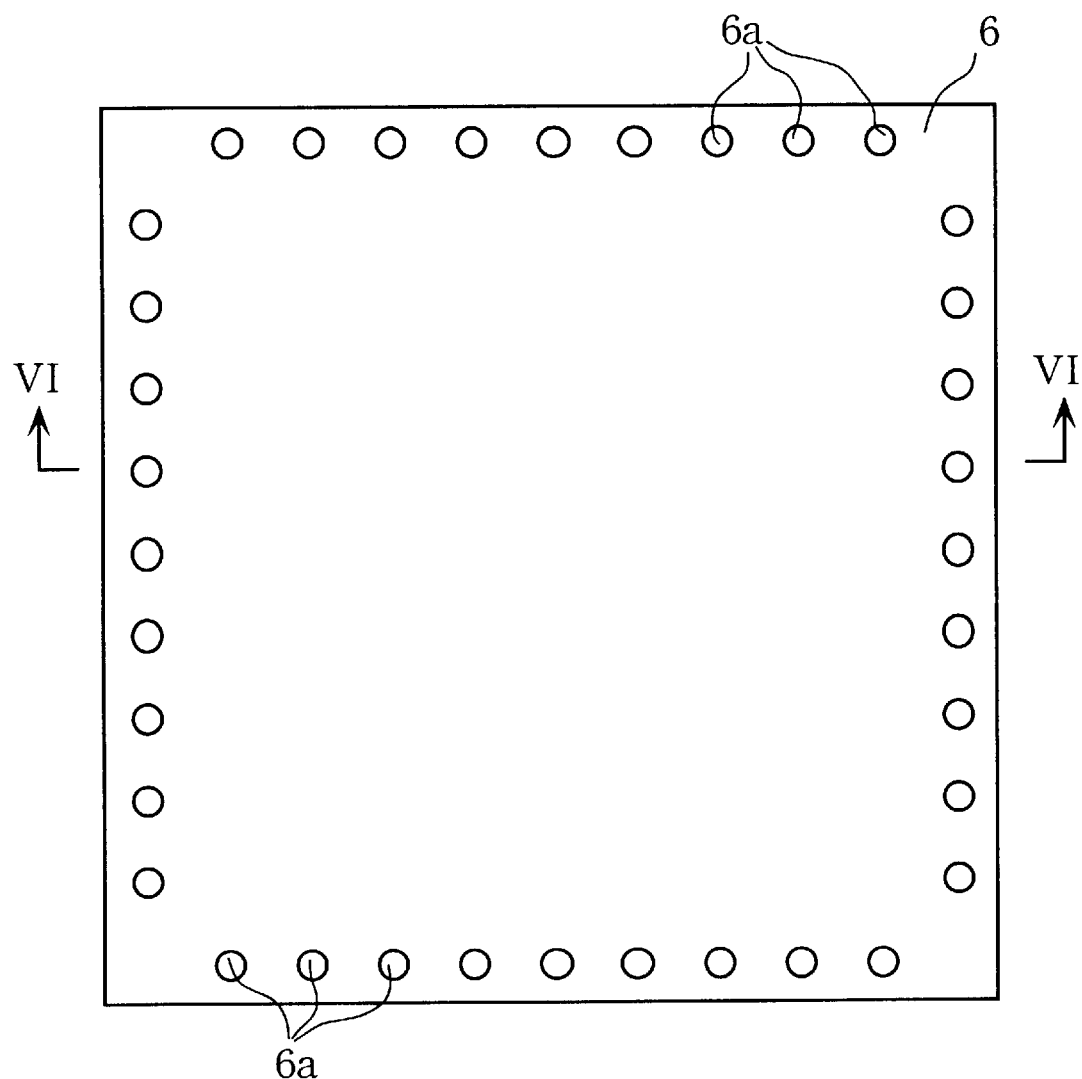
FIG. 5 is a bottom view showing a first insulating layer formed on the semiconductor chip.
Figure 6:
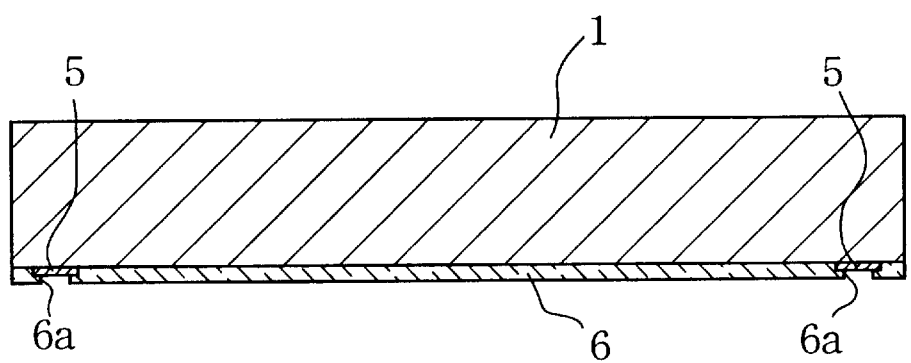
FIG. 6 is a sectional view taken on lines VI—VI in FIG. 5.

Then, as shown in FIGS. 5 and 6, a first insulating layer 6 is formed on the bottom surface of the IC chip 1. The insulating layer 6 has a plurality of first via-holes 6a in corresponding relationship to the electrode pads 5 of the IC chip 1, so that the electrode pads 5 are exposed at the via-holes 6a. The insulating layer 6 may be formed by depositing a glass material, whereas the via-holes 6a may be formed by known etching with use of a suitable mask. The insulating layer 6 serves as a passivation layer for the IC chip 1.

Figure 7:
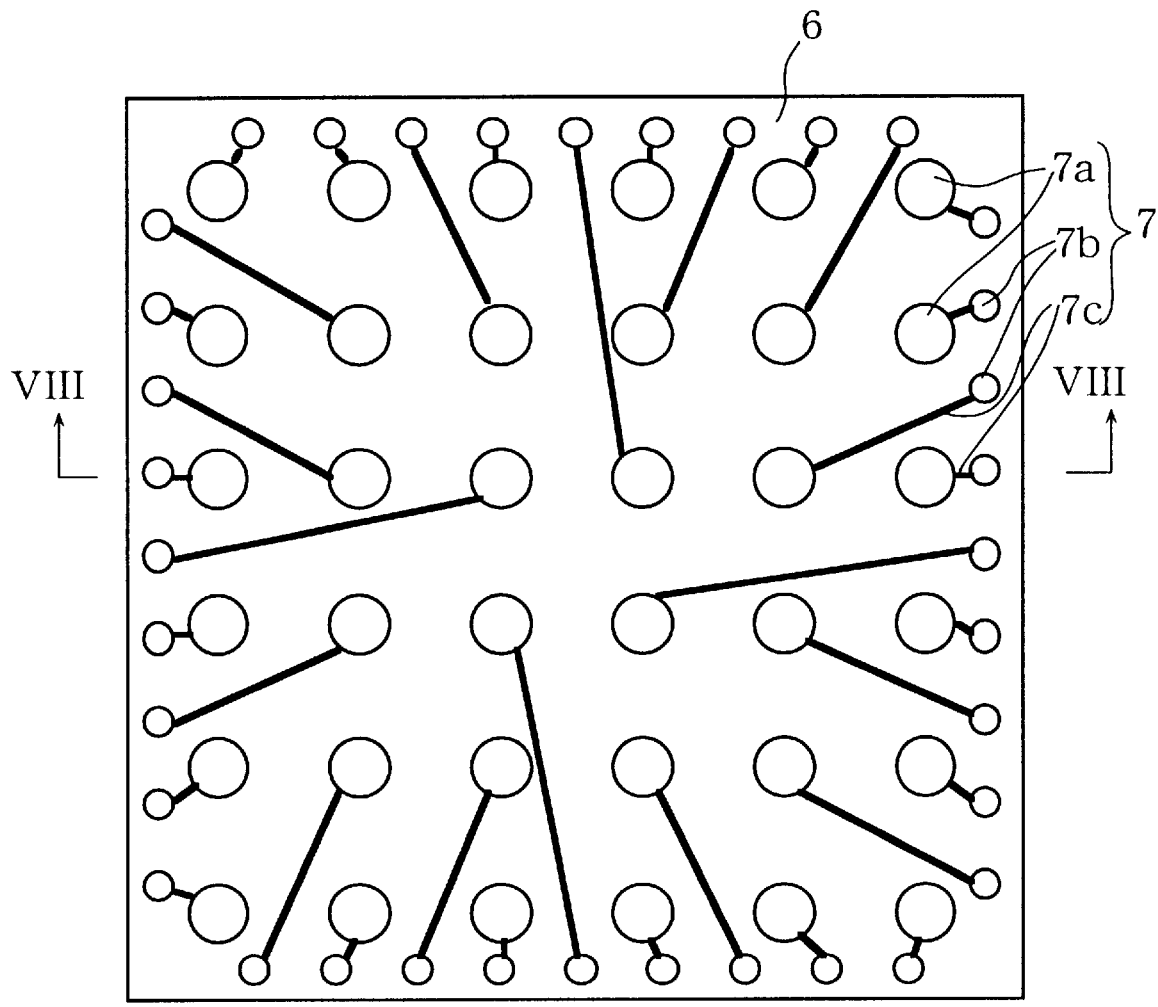
FIG. 7 is a bottom view showing a conductor pattern formed on the first insulating layer.
Figure 8:
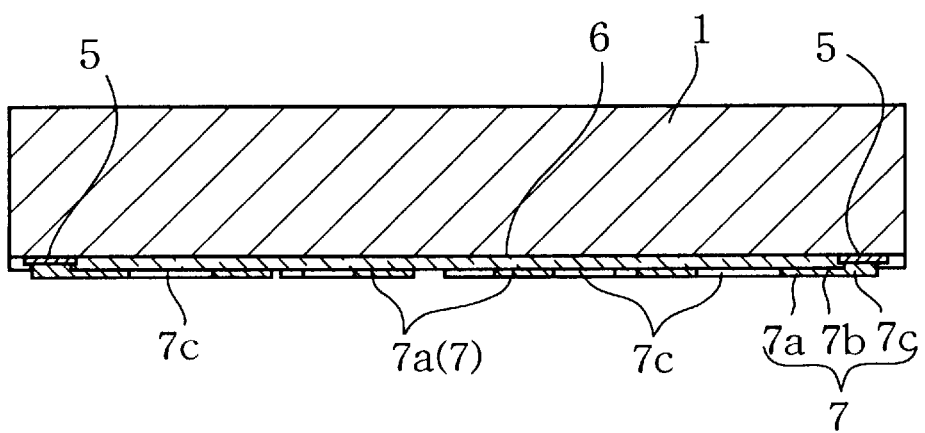
FIG. 8 is a sectional view taken on lines VIII—VIII in FIG. 7.

Then, as shown in FIGS. 7 and 8, a conductor pattern 7 is formed on the insulating layer 6. The conductor pattern 7 may be formed by first depositing a metal material such as aluminum to form a uniform conductor layer which is suitably patterned by subsequent etching. The conductor pattern 7 includes a matrix of connecting pads 7a corresponding in number to the electrode pads 5 (see FIG. 3) of the IC chip 1, a plurality of via-portions 7b each loaded in a respective one of the via-holes 6a (see FIG. 5) in contact with a respective one of the electrode pads 5, and a plurality of wiring portions 7c each connecting a relevant connecting pad 7a to a relevant via-portion 7b. In the illustrated embodiment, the matrix of connecting pads 7a is arranged in a square area defined by the plurality of via-portions 7b, and occupies a considerable surface area of the insulating layer 6.

Figure 9:
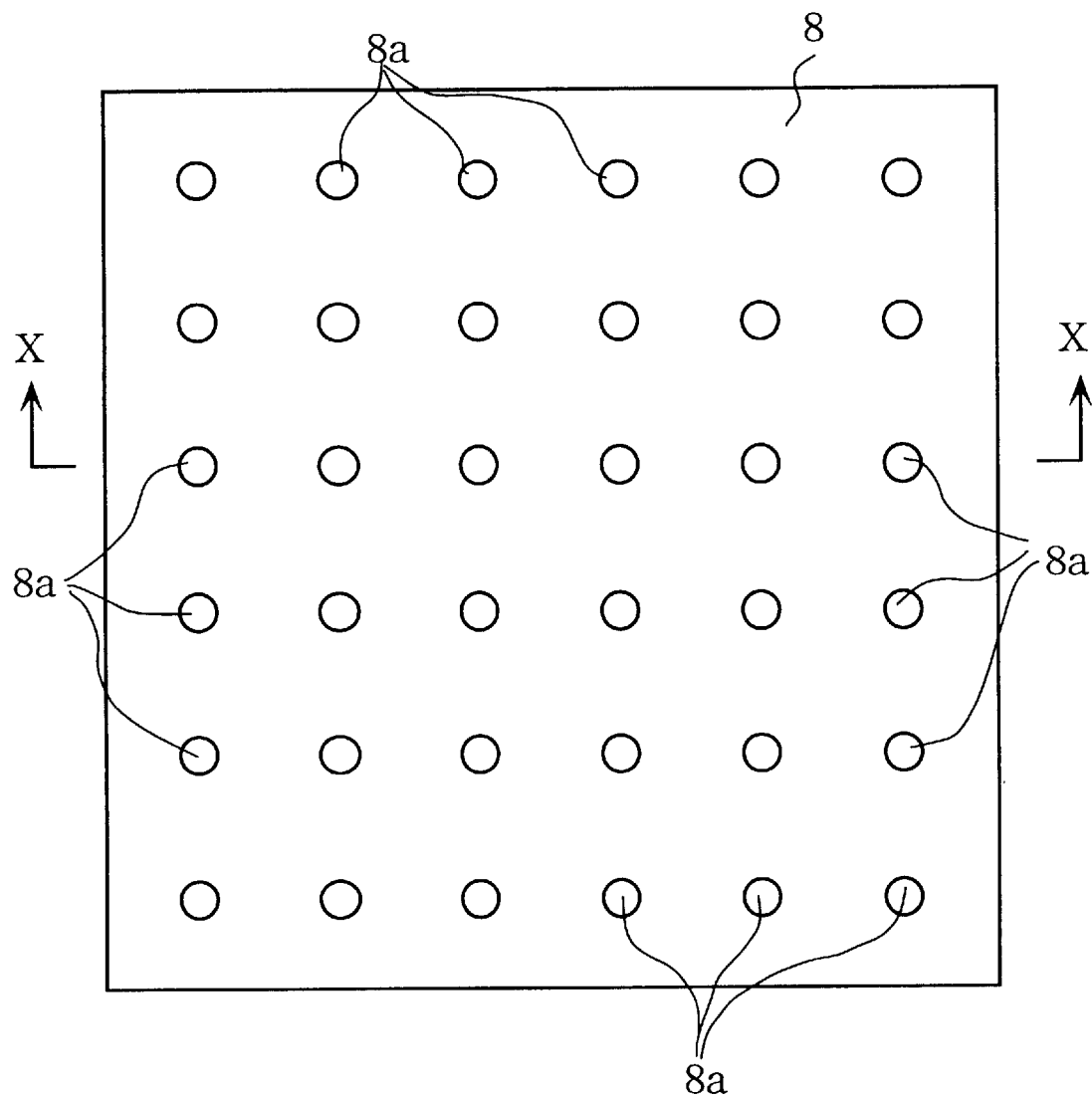
FIG. 9 is a bottom view showing a second insulating layer formed on the first insulating layer.
Figure 10:
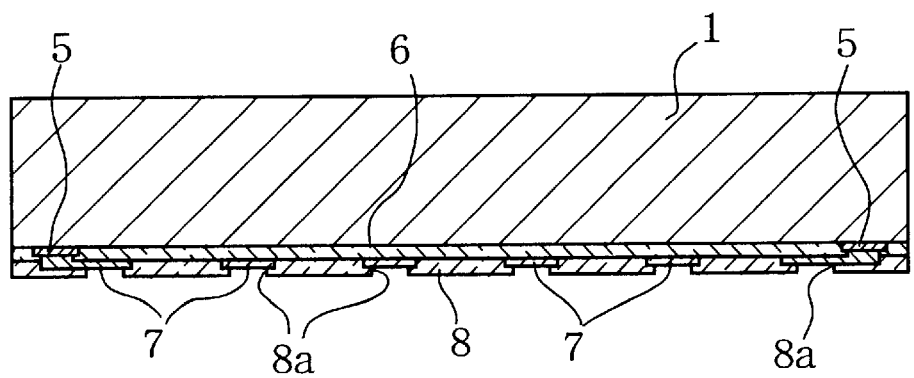
FIG. 10 is a sectional view taken on lines X—X in FIG. 9.

Then, as shown in FIGS. 9 and 10, a second insulating layer 8 is formed on the first insulating layer 6 to cover the conductor pattern 7. The second insulating layer 8 has a matrix of second via-holes 8a in corresponding relationship to the matrix of connecting pads 7a (see FIG. 7), so that the connecting pads 7a are exposed at the second via-holes 8a. Like the first insulating layer 6, the second insulating layer 8 may be formed by depositing a glass material, whereas the matrix of second via-holes 8a may be formed by known etching with use of a suitable mask. The second insulating layer 8 serves to protect the conductor pattern 7 on the first insulating layer 6.

Figure 11:
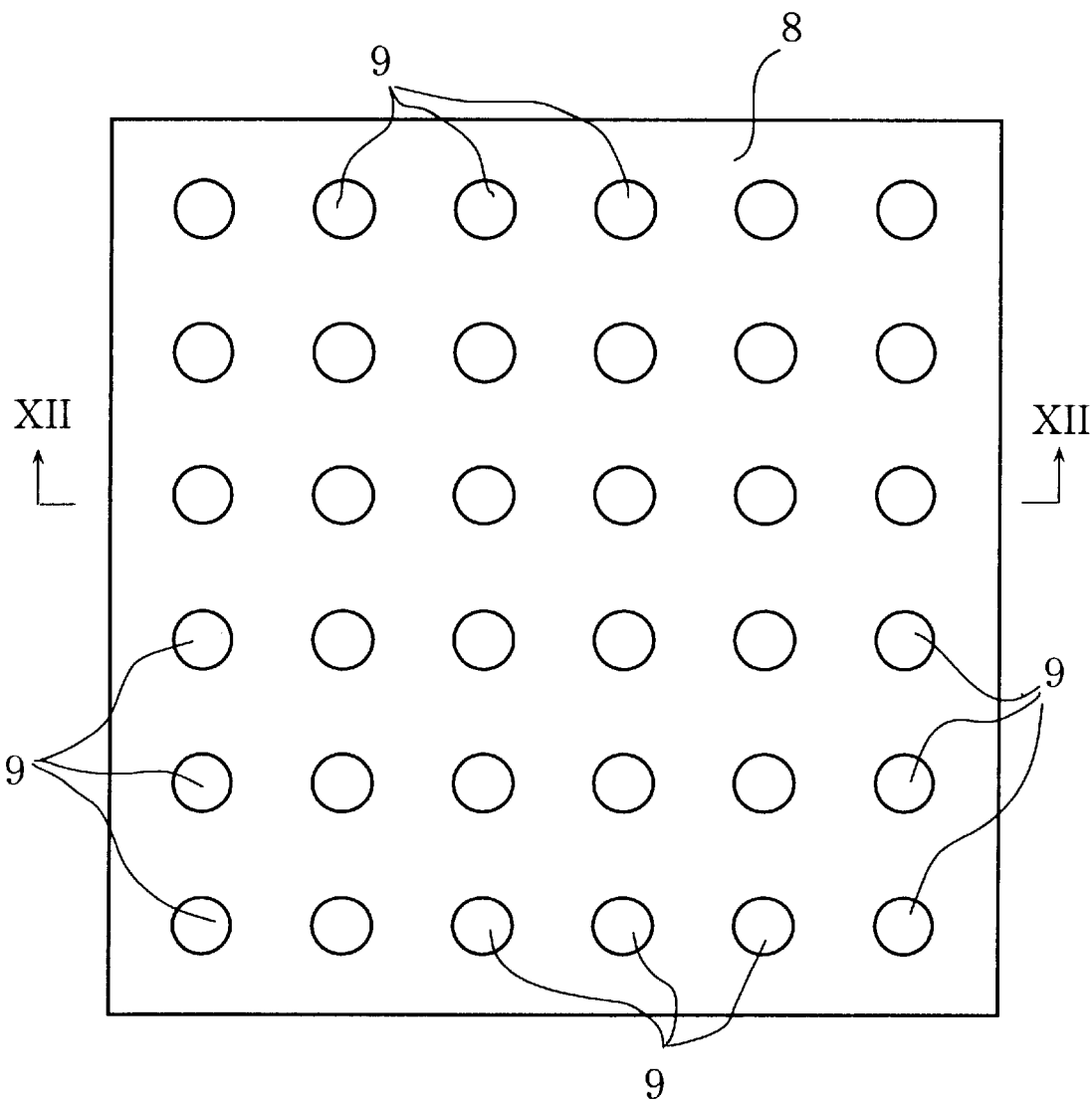
FIG. 11 is a bottom view showing a matrix of second terminals formed on the second insulating layer.
Figure 12:
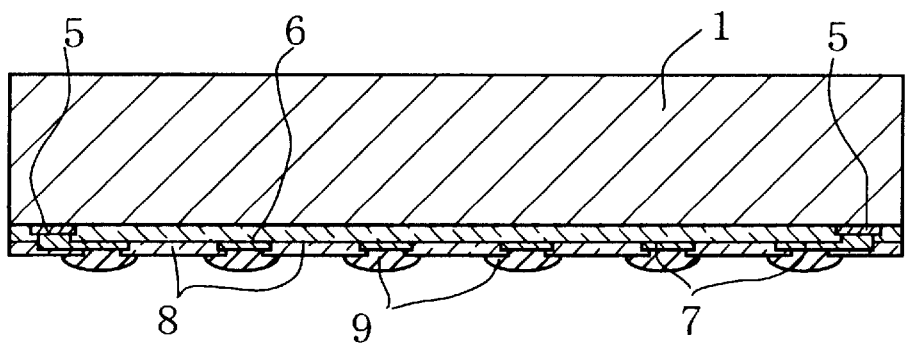
FIG. 12 is a sectional view taken on lines XII—XII in FIG. 9.

Then, as shown in FIGS. 11 and 12, a matrix of first terminal bumps 9 is provided on the second insulating layer 8. More specifically, each of the first terminal bumps 9 may be made of gold or solder by electrolytic plating or by melting for loading in a respective one of the second via-holes 8a of the second insulating layer 8 in contact with a respective one of the connecting pads 7a (see FIG. 8). Thus, the first terminal bumps 9 are held in electrical conduction with the electrode pads 5 of the IC chip 1 through the connecting pads 7a (namely, the conductor pattern 7).

Figure 13:
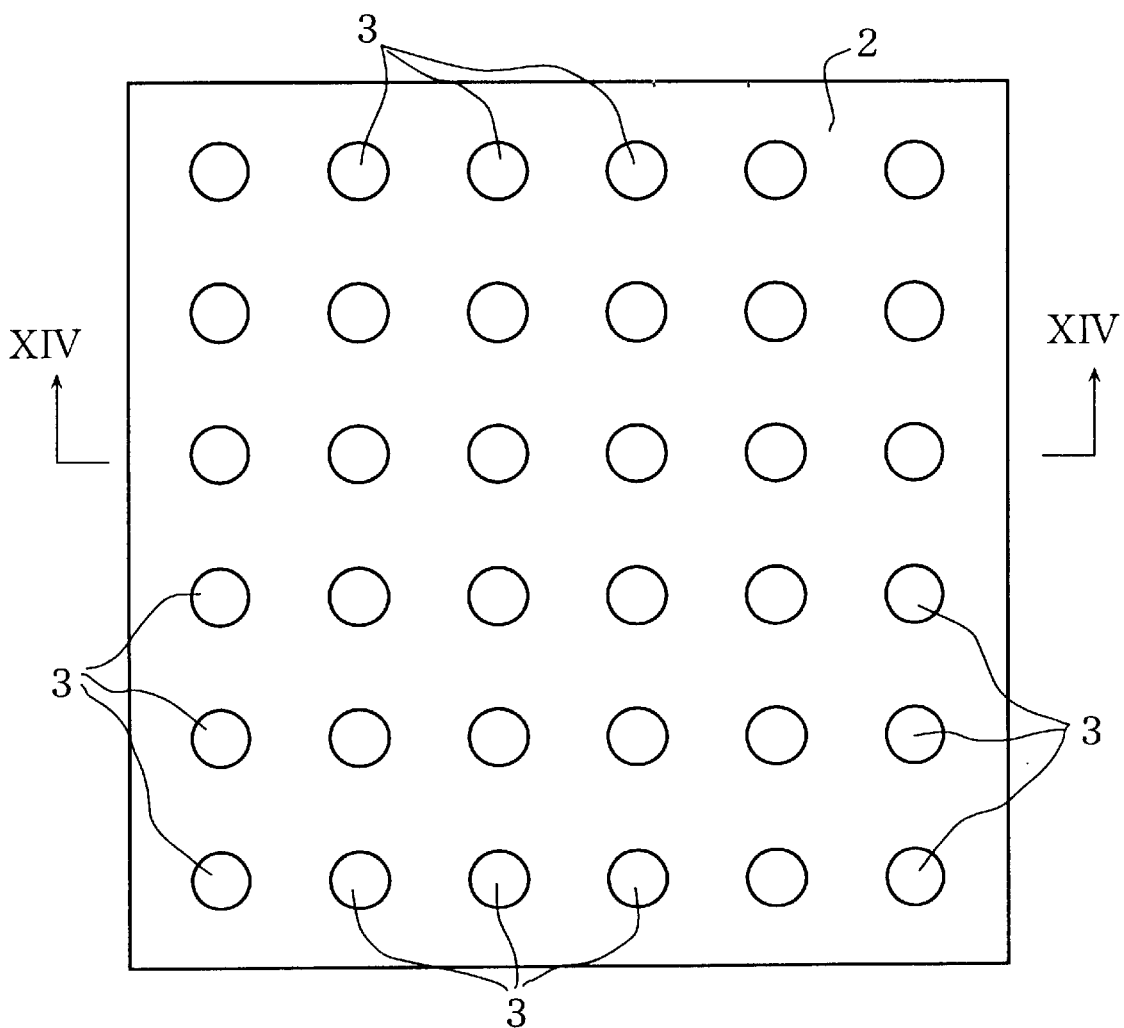
FIG. 13 is a bottom view showing an example of intermediary buffer board for use in producing the semiconductor device.
Figure 14:
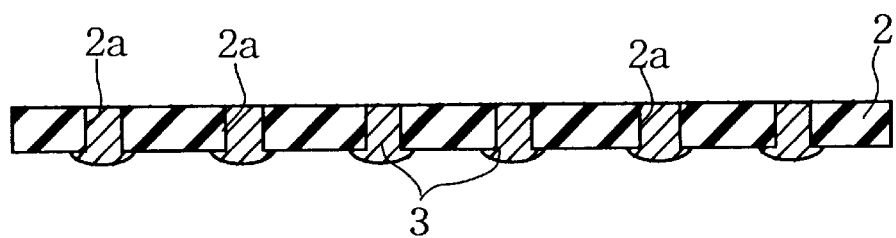
FIG. 14 is a sectional view taken on lines XIV—XIV in FIG. 13.

On the other hand, as shown in FIGS. 13 and 14, an intermediary buffer board 2 is prepared separately from the IC chip 1. Specifically, the buffer board 2, which is also square in the illustrated embodiment in corresponding relationship to the IC chip 1, may be made of a heat-resistant resin plate or sheet having a matrix of through-holes 2a each accommodating a second terminal bump 3. The matrix of through-holes 2a (and second terminal bumps 3 as well) corresponds positionally to the matrix of first terminal bumps 9 on the second insulating layer 8. Examples of the heat-resistant resin include polyimide and epoxy. The second terminal bumps 3 may be formed of solder or gold substantially in the same manner as the first terminal bumps 9 on the second insulating layer 8. As appreciated from FIG. 14, each of the second terminal bumps 3 is exposed on both surfaces of the buffer board 2.

Figure 15:
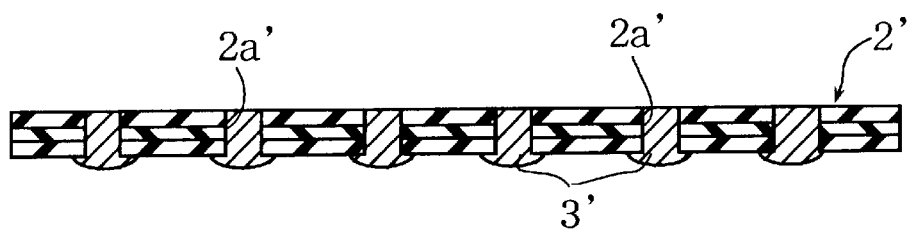
FIG. 15 is a sectional view similar to FIG. 14 but showing another example of intermediary buffer board.

If preferred or necessary, each of the second terminals 3 of the buffer board 2 may have a bump or bulge on each surface of the buffer board 2 though the illustrated second terminal 3 has a bulge only on one surface of the buffer board 2. Further, as shown in FIG. 15, a multi-layered buffer board 2' having a similar matrix of through-holes 2a' each receiving a second terminal bump 3' may be alternatively used depending on the required thickness of the buffer board.

Finally, the intermediary buffer board 2 thus prepared is attached to the IC chip 1 (as processed in the above-described manner) from below, so that the matrix of second terminal bumps 3 on the buffer board 2 are brought into electrical conduction with the matrix of first terminal bumps 9 on the IC chip 1, as shown in FIG. 1. The attachment between the IC chip 1 and the buffer board 2 may be established by a layer of adhesive 10 for example. Alternatively, an anisotropic conductive resin adhesive or film may be interposed between the IC chip 1 and the buffer board 2, whereby the anisotropic conductive resin is rendered electrically conductive only at each of the metal bumps 9 due to a higher pressurization of the anisotropic conductive resin.

According to the above-described structure of the semiconductor device A, the intermediary buffer board 2 allows for a difference in thermal expansion between the IC chip 1 and the printed circuit board B (see FIG. 2). Thus, the IC chip 1 can be prevented from being damaged due to such a thermal expansion difference.

As shown in FIG. 16, the buffer board 2 (or 2') may be prepared by cutting a master buffer board 20 into a plurality of unit buffer boards each having a length L and a width W. The length L and the width W may be equal in case each of the unit buffer boards 2 (or 2') is square.

As previously described, since the IC chip 1 has its own conductor pattern 7 (including the wiring portions 7c) electrically connecting the electrode pads 5 to the first terminal bumps 9, the buffer board 2 (or 2') itself does not need to have a wiring pattern for electrically connecting the electrode pads 5 to the second terminal bumps 3. In other words, the buffer board 2 needs only to have the terminals 3. Thus, a single kind of master buffer board 20 (see FIG. 16) is applicable to different kinds of semiconductor devices (e.g., IC chips) as long as the pitch between the terminals 3 (or 3') corresponds. It is therefore unnecessary to prepare different kinds of master buffer boards specially applicable to different kinds of semiconductor devices.

The preferred embodiment of the present invention being thus described, it is obvious that the same may be varied in various ways. For instance, the configuration of the semiconductor device A is not at all limitative, and the terminals 3 do not need to be disposed in a matrix arrangement. Such variations should not be regarded as a departure from the spirit and scope of the invention, and all such variations as would be obvious to those skilled in the art are intended to be included within the scope of the appended claims.

What is claimed is:

1. A semiconductor device comprising:
   a semiconductor ship having a mounting surface;
   a plurality of electrode pads formed on the mounting surface of the semiconductor chip;
   an insulating member formed on the mounting surface of the semiconductor chip;
   a conductor pattern formed on the insulating member and electrically connected to the electrode pads;
   a plurality of first terminals provided on the insulating member in electrical connection to the conductor pattern, the first terminals being arranged in a predetermined pattern; and
   an intermediary buffer board attached to the insulating member, the buffer board having a plurality of second terminals provided in a pattern identical to the predetermined pattern of the first terminals in electrical connection thereto.

2. The semiconductor device according to claim 1, wherein the mounting surface has a boundary the electrode pads being disposed along the boundary of the mounting surface, the first terminals being arranged in a bonding area surrounded by the electrodes pads.

3. The semiconductor device according to claim 2, wherein the insulating member includes a first insulating layer formed on the mounting surface of the semiconductor chip and a second insulating layer formed on the first insulating surface, the first insulating layer having a plurality of first via-holes in corresponding relationship to the electrode pads, the conductor pattern being formed on the first insulating layer and electrically connected to the electrode pads through the first via-holes, the second insulating layer having a plurality of second via-holes formed in the bonding area, each of the second via-holes receiving a respective one of the first terminals in electrical conduction with the conductor pattern.

4. The semiconductor device according to claim 3, wherein the conductor pattern comprises:
   a plurality of via-portions each provided in a respective one of the first via-holes of the first insulating layer;
   a plurality of connecting pads formed on the first insulating layer in corresponding relationship to the first terminals; and
   a plurality of wiring portions formed on the first insulating layer, each of the wiring portions connecting a respective one of the via-portions to a respective one of the connecting pads.

5. The semiconductor device according to claim 1, wherein each of the first terminals comprises a metal bump.

6. The semiconductor device according to claim 1, wherein each of the second terminals comprises a metal bump.

7. The semiconductor device according to claim 2, wherein the first terminals are disposed in a matrix arrangement in the bonding area.

8. The semiconductor device according to claim 7, wherein the second terminals are disposed in a matrix arrangement in the corresponding relationship to the first terminals.

9. The semiconductor device according to claim 1, wherein the buffer board has a plurality of through-holes each receiving a respective one of the second terminals.

* * * * *